(12) United States Patent
Xie et al.

(10) Patent No.: US 8,541,274 B1
(45) Date of Patent: *Sep. 24, 2013

(54) METHODS OF FORMING 3-D SEMICONDUCTOR DEVICES WITH A NANOWIRE GATE STRUCTURE WHEREIN THE NANOWIRE GATE STRUCTURE IS FORMED AFTER SOURCE/DRAIN FORMATION

(75) Inventors: Ruilong Xie, Niskayuna, NY (US);
Xiuyu Cai, Jr., Albany, NY (US);
Kangguo Cheng, Schenectady, NY (US); Ali Khakifirooz, Mountain View, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 13/609,828

(22) Filed: Sep. 11, 2012

(51) Int. Cl.
*H01L 21/8238* (2006.01)

(52) U.S. Cl.
USPC ............... 438/212; 438/478; 257/E21.635

(58) Field of Classification Search
USPC .................................................. 438/212, 478
See application file for complete search history.

(56) References Cited

U.S. PATENT DOCUMENTS

| | | | |
|---|---|---|---|
| 7,235,436 B1 | 6/2007 | Lin et al. | |
| 7,981,736 B2* | 7/2011 | Juengling | 438/157 |
| 8,034,689 B2* | 10/2011 | Lenoble et al. | 438/283 |
| 8,076,231 B2 | 12/2011 | Saitoh et al. | |
| 8,159,018 B2 | 4/2012 | Akil et al. | |
| 2009/0294839 A1* | 12/2009 | Doyle et al. | 257/327 |
| 2011/0012201 A1* | 1/2011 | Yagishita et al. | 257/347 |
| 2011/0097881 A1 | 4/2011 | Vandervorst et al. | |
| 2012/0037994 A1 | 2/2012 | Saitoh et al. | |
| 2012/0126338 A1* | 5/2012 | Juengling | 257/401 |
| 2013/0065371 A1* | 3/2013 | Wei et al. | 438/294 |

* cited by examiner

*Primary Examiner* — Alexander Ghyka
(74) *Attorney, Agent, or Firm* — Williams, Morgan & Amerson, P.C.

(57) ABSTRACT

In one example, the method disclosed herein includes forming a fin comprised of a semiconducting material, wherein the fin has a first, as-formed cross-sectional configuration, forming a sacrificial gate structure above the fin, forming sidewall spacers adjacent at least a portion of the sacrificial gate structure and removing the sacrificial gate structure to thereby define a gate cavity that exposes a portion of the fin. The method also includes the steps of performing a fin reflow process on the exposed portions of the fin to define a nanowire structure having a cross-sectional configuration that is different from the first cross-sectional configuration and forming a replacement gate structure in the gate cavity and at least partially around the nanowire structure.

15 Claims, 21 Drawing Sheets

METHODS OF FORMING 3-D SEMICONDUCTOR DEVICES WITH A NANOWIRE GATE STRUCTURE WHEREIN THE NANOWIRE GATE STRUCTURE IS FORMED AFTER SOURCE/DRAIN FORMATION

BACKGROUND OF THE INVENTION

1. Field of the Invention

Generally, the present disclosure relates to the manufacture of sophisticated semiconductor devices, and, more specifically, to various methods of forming 3-D semiconductor devices, such as FinFET devices, with a nanowire gate structure wherein the nanowire gate structure is formed after source/drain formation, and the resulting devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3-D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

Device manufacturers are under constant pressure to produce integrated circuit products with increased performance and lower production costs relative to previous device generations. Thus, device designers spend a great amount of time and effort to maximize device performance, while seeking ways to reduce manufacturing costs and improve manufacturing reliability. As it relates to 3D devices, device designers have spent many years and employed a variety of techniques in an effort to improve the performance capability and reliability of such devices.

The present disclosure is directed to various methods of forming a three-dimensional (3-D) semiconductor device with a nanowire gate structure

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming 3-D semiconductor devices, such as FinFET devices, with a nanowire gate structure wherein the nanowire gate structure is formed after source/drain formation, and the resulting devices. In one example, the method disclosed herein includes forming a fin comprised of a semiconducting material, wherein the fin has a first, as-formed cross-sectional configuration, forming a sacrificial gate structure above the fin, forming sidewall spacers adjacent at least a portion of the sacrificial gate structure and removing the sacrificial gate structure to thereby define a gate cavity that exposes a portion of the fin. The method also includes the steps of performing a fin reflow process on the exposed portions of the fin to define a nanowire structure having a cross-sectional configuration that is different from the first cross-sectional configuration and forming a replacement gate structure in the gate cavity and at least partially around the nanowire structure.

Another illustrative method disclosed herein includes forming a fin comprised of a silicon, wherein the fin has a first, as-formed cross-sectional configuration, forming a sacrificial gate structure above the fin, forming sidewall spacers adjacent at least a portion of the sacrificial gate structure and removing the sacrificial gate structure to thereby define a gate cavity that exposes a portion of the fin. The method includes the additional steps of performing a hydrogen anneal process on the exposed portions of the fin to define a nanowire structure having a cross-sectional configuration that is different from the first cross-sectional configuration and forming a replacement gate structure in the gate cavity and completely around an outer surface of the nanowire structure.

BRIEF DESCRIPTION OF THE DRAWINGS

The disclosure may be understood by reference to the following description taken in conjunction with the accompanying drawings, in which like reference numerals identify like elements, and in which.

Figure 1A:
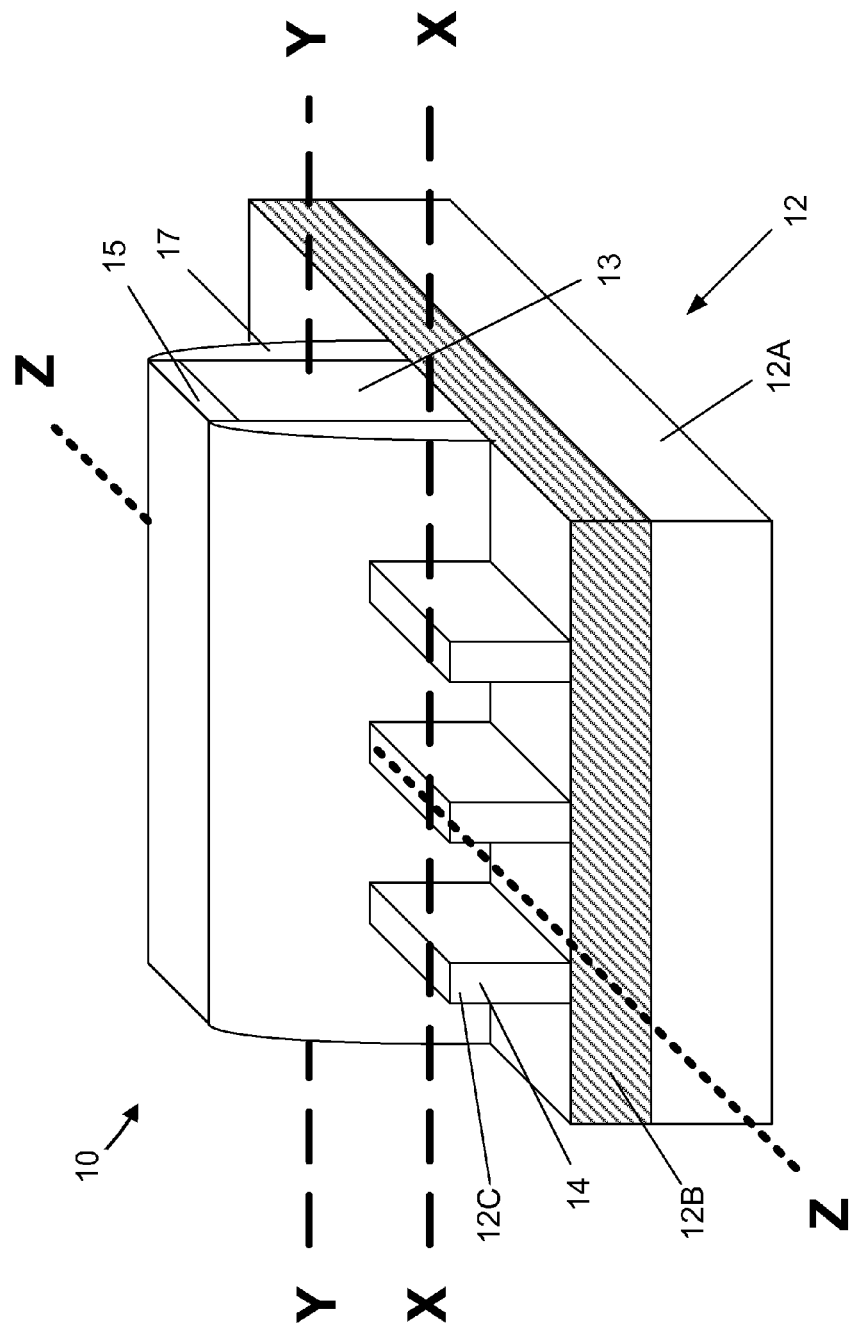
FIGS. 1A-1I depict one illustrative method disclosed herein for forming an illustrative FinFET device with a nanowire gate structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to forming a 3-D semiconductor device, such as a FinFET device, wherein the gate structure is comprised of one or more nanowires. In the example described herein, the gate structure of the device 10 is depicted as being comprised of two illustrative nanowires. However, after a complete reading of the present application, those skilled in the art will appreciate that the gate structure may be comprised of any desired number of such nanowire structures and in some cases may be comprised of only a single nanowire structure. Thus, the inventions disclosed herein should not be considered as being limited to a device with any particular number of such nanowire structures. Moreover, as will be readily apparent to those skilled in the art upon a complete reading of the present application, the present method is applicable to a variety of devices, including, but not limited to, logic devices, memory devices, etc.

FIG. 1A is a perspective view of an illustrative FinFET semiconductor device 10 at an early stage of manufacturing that is formed above a semiconducting substrate 12. The substrate 12 may have a variety of configurations, such as the depicted silicon-on-insulator (SOI) configuration, or a bulk substrate configuration. In the depicted example, the substrate 12 includes a bulk semiconducting (e.g., silicon) layer 12A, a buried insulation layer 12B (a so-called "BOX" layer) and an active layer 12C, wherein semiconductor devices are formed in and above the active layer 12C. The substrate 12 may be made of silicon or it may be made of materials other than silicon. Thus, the terms "substrate" or "semiconducting substrate" should be understood to cover all semiconducting materials and all forms of such materials.

The illustrative device 10 includes a plurality of fins 14 that are defined in the active region 12C, a gate electrode 13, sidewall spacers 17 and a gate cap layer 15. FIG. 1A depicts the locations where various cross-sectional views of the device 10 will be taken in the drawings discussed below. More specifically, view "X-X" is a cross-sectional view taken through the fins 14 in a direction that is transverse to the long axis of the fins 14, view "Y-Y" is a cross-sectional view taken through the gate electrode 13 in a direction that is parallel to the long axis of the gate electrode 13, i.e., in the gate width direction, and view "Z-Z" is a cross-sectional view taken along the long axis of the fins 14. It should be understood that FIG. 1A is only provided to show the location of the various cross-sectional views depicted in the drawings below, and many aspects discussed below are not depicted in FIG. 1A so as to not overly complicate the device 10 depicted in FIG. 1A.

Figure 1B:
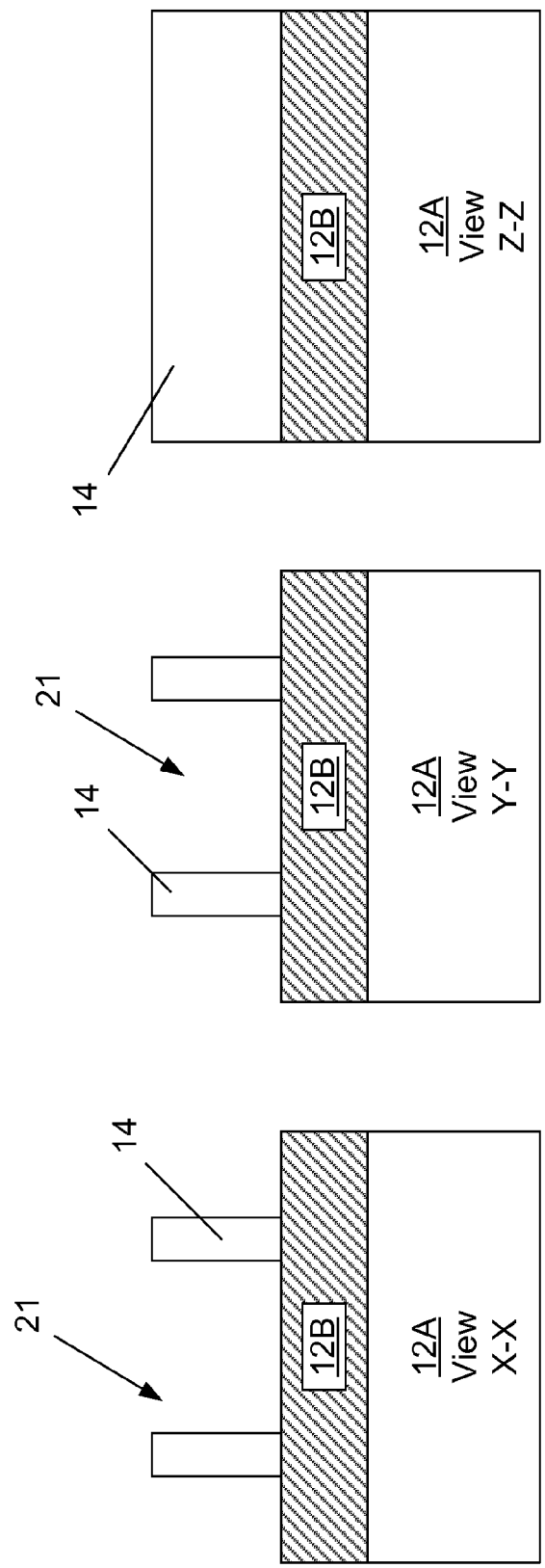

At the point of fabrication depicted in FIG. 1B, various process operations have been performed to define various structures for the device 10. More specifically, a plurality of fins 14 have been defined in the active layer 12C of the substrate 12 using a variety of known techniques. More specifically, in one illustrative process flow, an etching process, such as a dry or wet etching process, was performed on the active layer 12C through a patterned mask layer (not shown) to form a plurality of trenches 21 in the active layer 12C. This etching process results in the definition of a plurality of fins 14. The overall size, shape and configuration of the trenches 21 and fins 14 may vary depending on the particular application. The depth and width of the trenches 21 may vary depending upon the particular application. In one illustrative embodiment, based on current day technology, the depth of the trenches 21 may range from approximately 15-30 nm and the width of the trenches 21 may range from about 20-50 nm. In some embodiments, the fins 14 may have a width within the range of about 5-30 nm. In the illustrative example depicted in the attached drawings, the trenches 21 and fins 14 are all of a uniform size and shape. However, as discussed more fully below, such uniformity in the size and shape of the trenches 21 and the fins 14 is not required to practice at least some aspects of the inventions disclosed herein. In the example depicted herein, the trenches 21 are formed by performing an anisotropic etching process that results in the trenches 21 having a schematically depicted, generally rectangular configuration. In an actual real-world device, the sidewalls of the trenches 21 may be somewhat inwardly tapered, although that configuration is not depicted in the drawings. In some cases, the trenches 21 may have a reentrant profile near the bottom of the trenches 21. To the extent the trenches 21 are formed by performing a wet etching process, the trenches 21 may tend to have a more rounded configuration or non-linear configuration as compared to the generally rectangular configuration of the trenches 21 that are formed by performing an anisotropic etching process. Thus, the size and configuration of the trenches 21, and the manner in which they are made, should not be considered a limitation of the present invention. For ease of disclosure, only the substantially rectangular trenches 21 will be depicted in subsequent drawings.

Figure 1C:
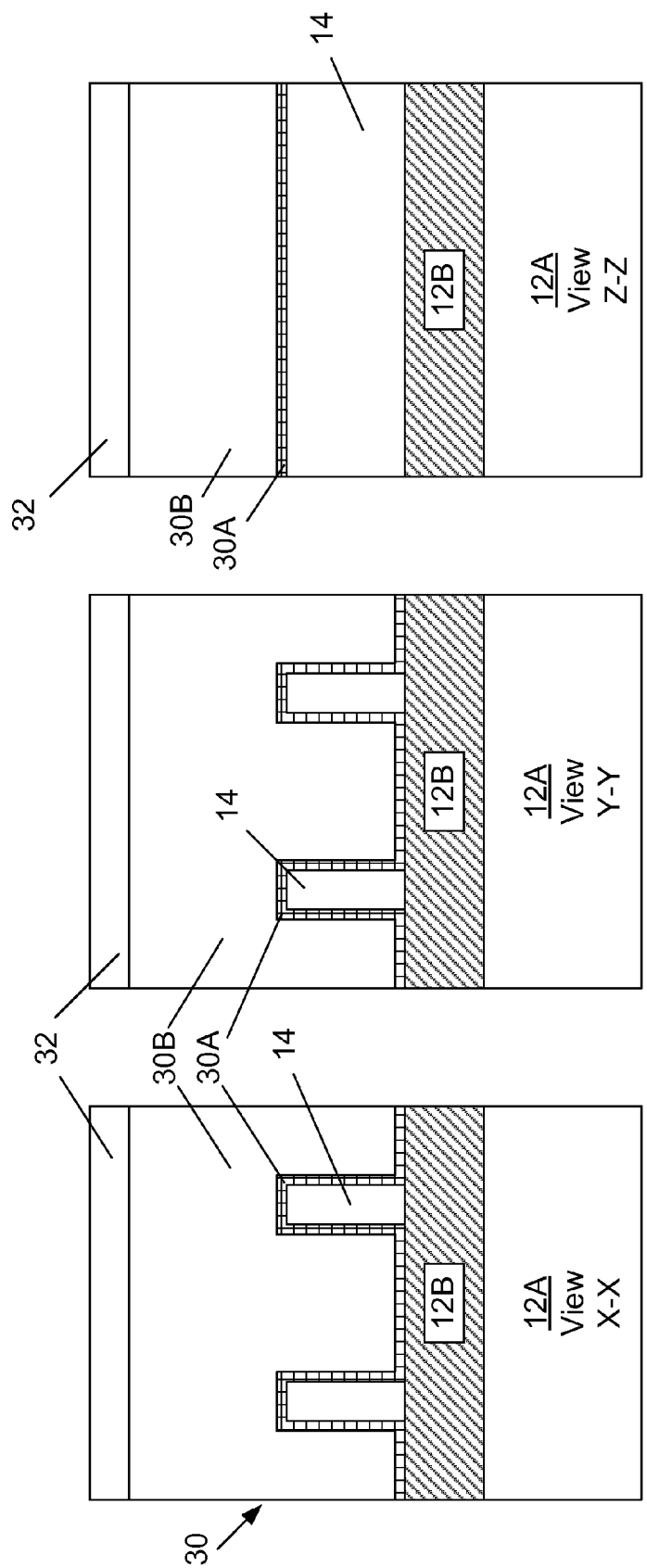
Figure 1D:
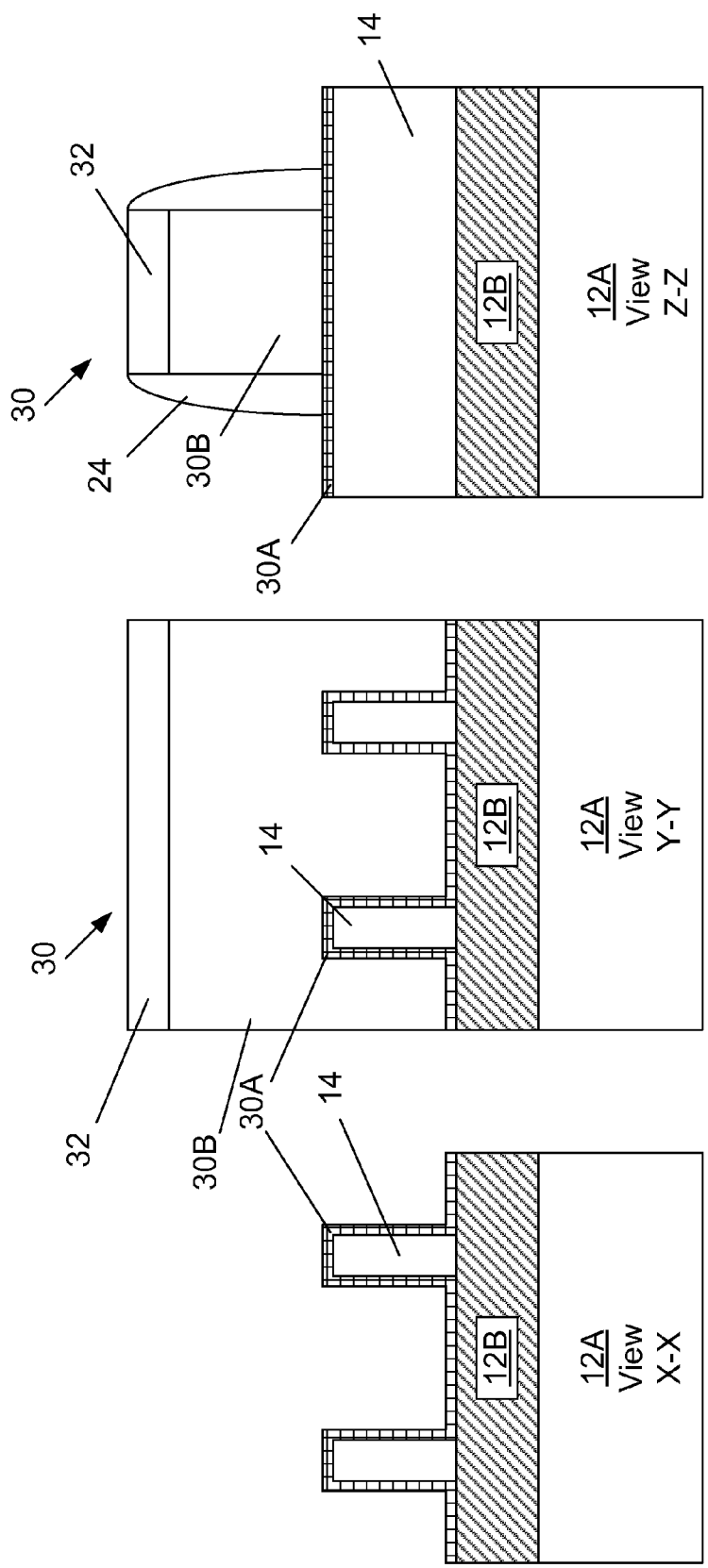

FIGS. 1C-1D depict various process operations that are performed to form a sacrificial gate structure 30 on the device 10. In one illustrative process flow, the hard mask layer that was used in the previous etching process that was performed to define the trenches 21 and fins 14 is removed, although removal of the hard mask may not be required in all applications. With continuing reference to FIG. 1C, the process begins with the formation of several layers of material above the substrate 12: a sacrificial gate insulation layer 30A, a sacrificial gate electrode layer 30B and a mask layer 32. Such layers may be formed using a variety of different materials and by performing a variety of known techniques. For example, the sacrificial gate insulation layer 30A may be comprised of silicon dioxide, the sacrificial gate electrode layer 30B may be comprised of polysilicon or amorphous silicon and the mask layer 32 may be comprised of silicon nitride. The sacrificial gate insulation layer 30A, sacrificial gate electrode layer 30B and the mask layer 32 may be of any desired thickness or configuration. Moreover, the mask layer 32 could be comprised of multiple layers of material, such as, for example, a combination of a silicon nitride layer and a layer of silicon dioxide. Thus, the particular form and composition of the mask layer 32 and the manner in which it is made should not be considered a limitation of the present invention. Of course, those skilled in the art will recognize that there are other features of the FinFET device 10 that are not depicted in the drawings so as not to obscure the present invention. For example, so-called halo implant regions and various layers or regions of silicon/germanium that are typically found in high performance PFET transistors are not depicted in the drawings. The layers of material depicted in FIG. 1C may be formed by any of a variety of different known techniques, e.g., a chemical vapor deposition (CVD) process, an atomic layer deposition (ALD) process, a thermal growth process, etc.

As shown in FIG. 1D, one or more patterning and etching processes are performed to define the sacrificial gate electrode 30B and the gate cap layer 32. Typically, the mask layer 32 is patterned using known photolithography and etching techniques to thereby define a patterned mask layer. Alternatively, the mask layer 32 may be patterned using known sidewall image transfer techniques. Thereafter, one or more etching processes are performed through the patterned mask layer to remove exposed portions of the sacrificial gate electrode layer 30A to thereby define the depicted sacrificial gate electrode 30A.

With continuing reference to FIG. 1D, a sidewall spacer 24 (best seen in view "Z-Z") is formed adjacent the replacement gate electrode 30B. The spacer 24 may be formed by conformably depositing a layer of spacer material and thereafter performing an anisotropic etching process to define the sidewall spacers 24. The spacers 24 may be comprised of a variety of different materials, such as silicon nitride, silicon carbon nitride (SiCN), etc. The spacers 24 may have a base thickness of about 5-20 nm. Within the trenches 21, the sidewall spacers 24 do not form to any appreciable extent due to the relatively short height of the fins 14 and the duration of the etching process.

Figure 1E:
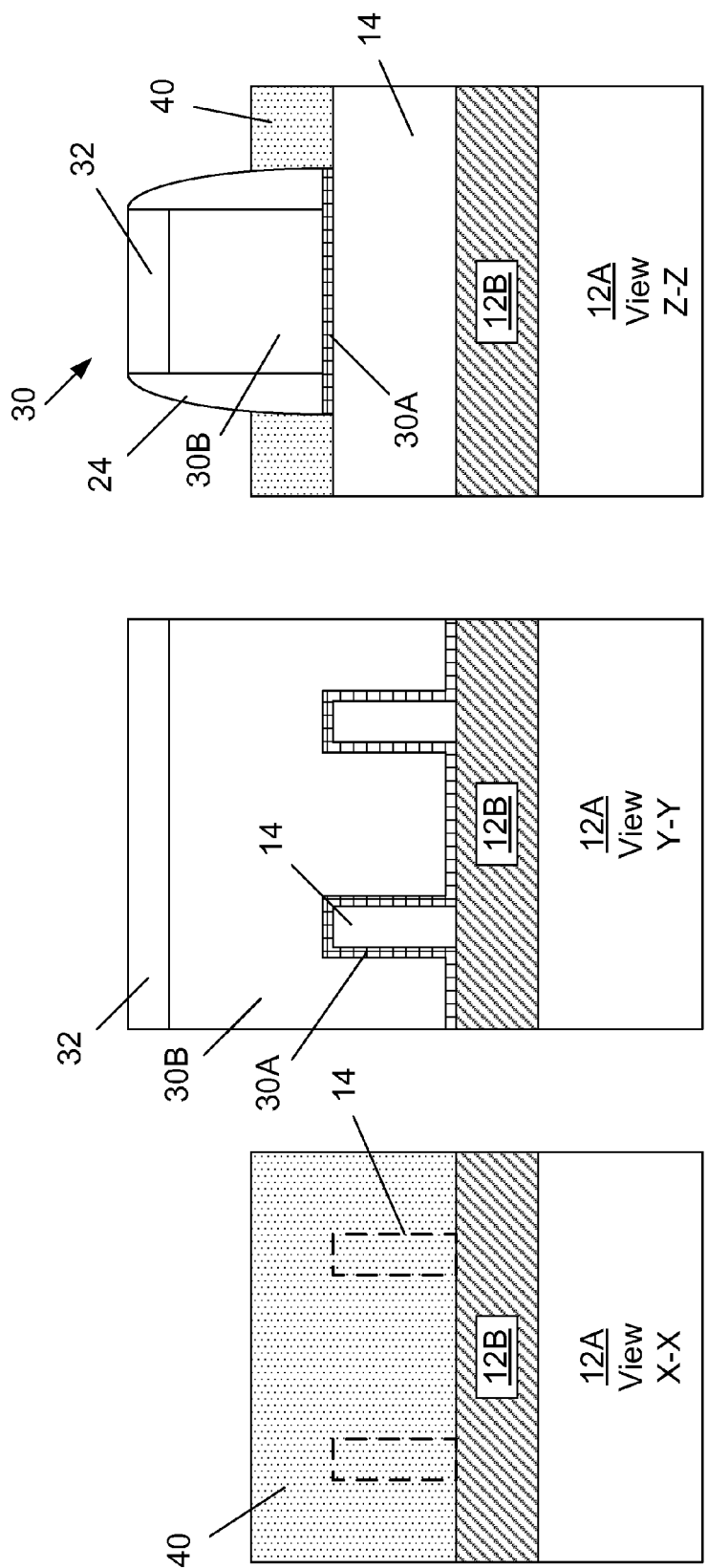

FIG. 1E depicts the device 10 after several process operations have been performed. First, one or more etching processes were performed to remove the sacrificial gate insulation layer 30A from the fins 14 outside of the gate region. Thereafter, an epi deposition process was performed to form a semiconductor material 40 on the fins, i.e., this process is sometimes referred to as "merging" the fins 14 together. However, this fin merger process is optional in nature and not required to practice the novel inventions disclosed herein.

Figure 1F:
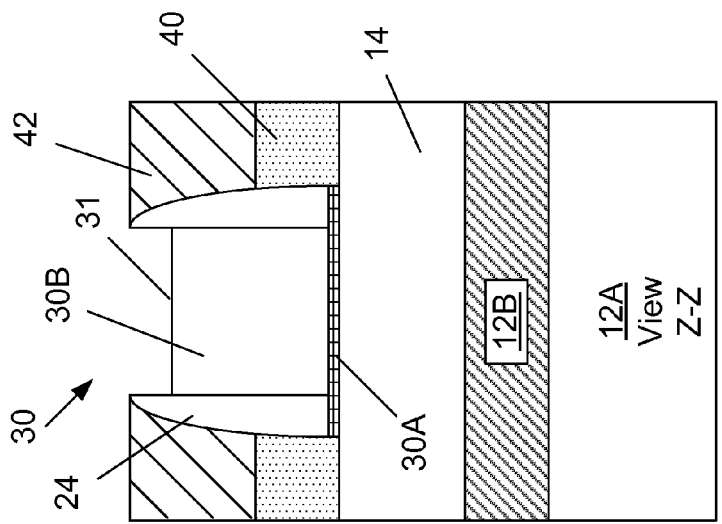
Figure 1F:
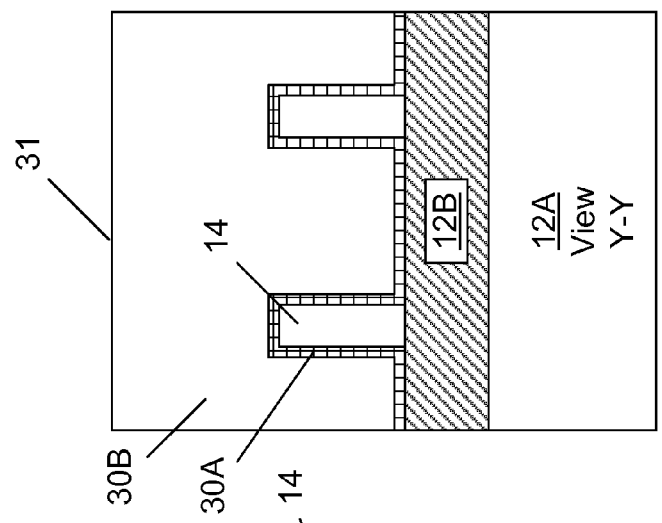
Figure 1F:
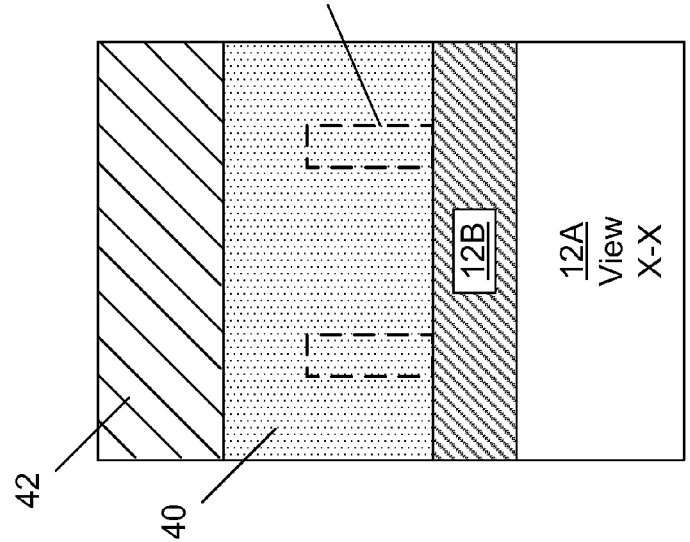

FIG. 1F depicts the device 10 after several process operations have been performed. First, a layer of material 42, such as a layer of insulating material, was blanket-deposited across the device 10. The layer of material 42 may be comprised of a variety of different materials, such as silicon dioxide, etc., and it may be formed by performing a variety of techniques, e.g., chemical vapor deposition (CVD), etc. Thereafter, a chemical mechanical polishing (CMP) process was performed to planarize the upper surface of the layer of material 42 using the gate cap layer 32 (see FIG. 1E) as a polish stop layer. The CMP process exposes the upper surface of the gate cap layer 32 for further processing. Thereafter, an etching process was performed to remove the exposed gate cap layer 32 selectively relative to the layer of material 42. The removal of the gate cap layer 32 exposes the upper surface 31 of the sacrificial gate electrode 30B for further processing.

Figure 1G:
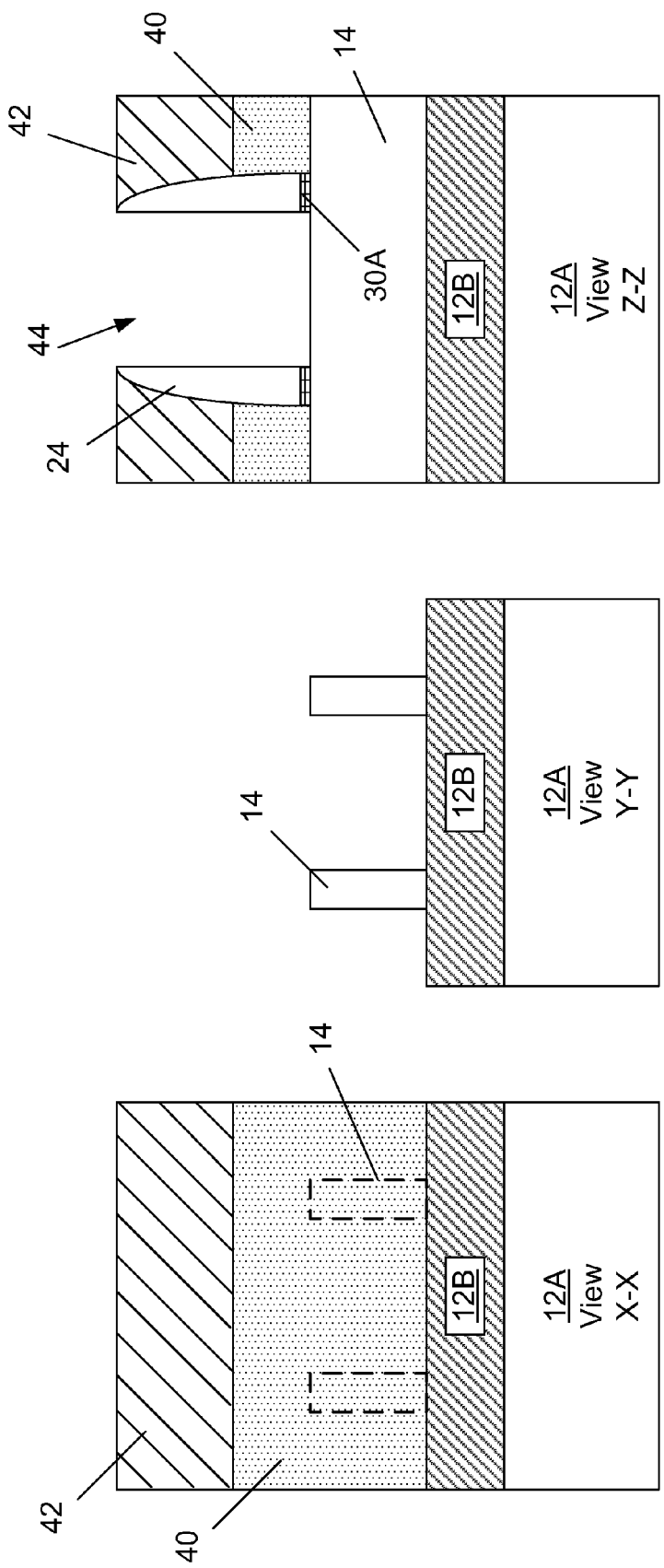

FIG. 1G depicts the device 10 after one or more etching processes have been performed to remove the sacrificial gate electrode 30B (see FIG. 1F) and the sacrificial gate insulation layer 30A to thereby define a gate cavity 44 that is laterally defined by the spacers 24 and thereby expose the portions of the fins 14 that underlie the gate cavity 44.

Figure 1H:
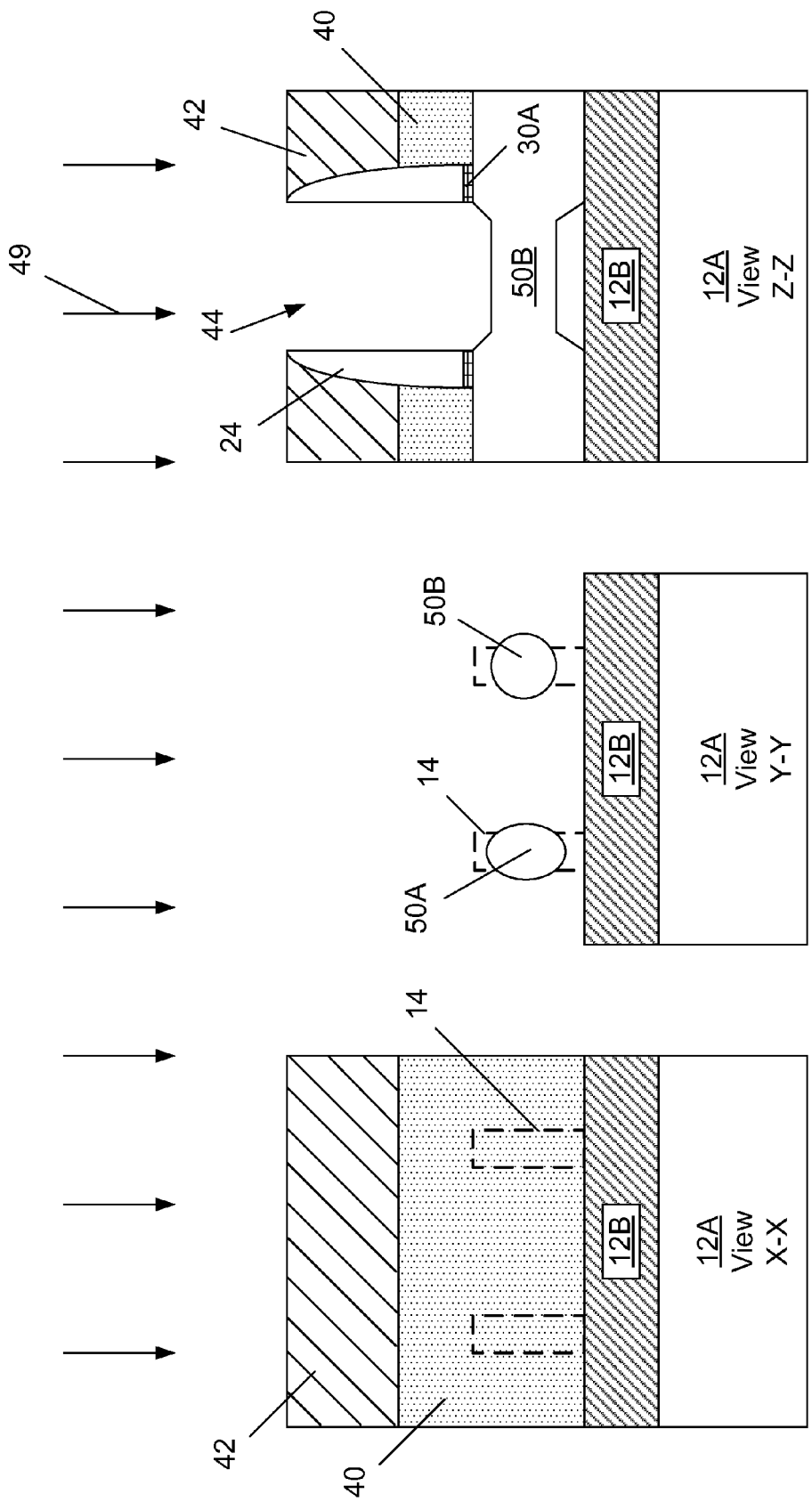

FIG. 1H depicts the device 10 after a fin reflow process 49 is performed through the gate cavity 44 on the exposed portions of the fins 14 that underlie the gate cavity 44. In general, the fin reflow process 49 changes the as-formed cross-sectional configuration of the fins 14 from the approximate rectangular cross-sectional configuration (depicted by dashed lines in FIG. 1H—view X-X) to the illustrative nanowires 50A, 50B that have a cross-sectional configuration that is different from the as-formed cross-sectional configuration of the original fins 14. For example, as depicted in the FIG. 1H example, the nanowires 50A, 50B may have a substantially rod-like cross-sectional configuration. In this fin reflow process 49, the cross-sectional area of the original fins 14 and the cross-sectional area of the nanowires 50A, 50B may be approximately the same. Note that the rod-like configurations need not be a perfect geometric form, and all fins 14 subjected to the fin reflow process 49 need not have the same cross-sectional configuration. For example, while the nanowire 50A has a generally elliptical cross-sectional configuration, the nanowire 50B may have a generally circular cross-sectional configuration. View Z-Z in FIG. 1H only depicts the illustrative nanowire 50B. In one illustrative embodiment, where the fins 14 are made of silicon, the fin reflow process may be a hydrogen anneal process performed in a furnace at a temperature within the range of about 900-1100° C. for a duration of about 60-600 seconds and at a pressure that falls within the range of 2-50 Torr. During the illustrative hydrogen anneal process, a hydrogen ambient is maintained in the furnace.

Figure 1I:
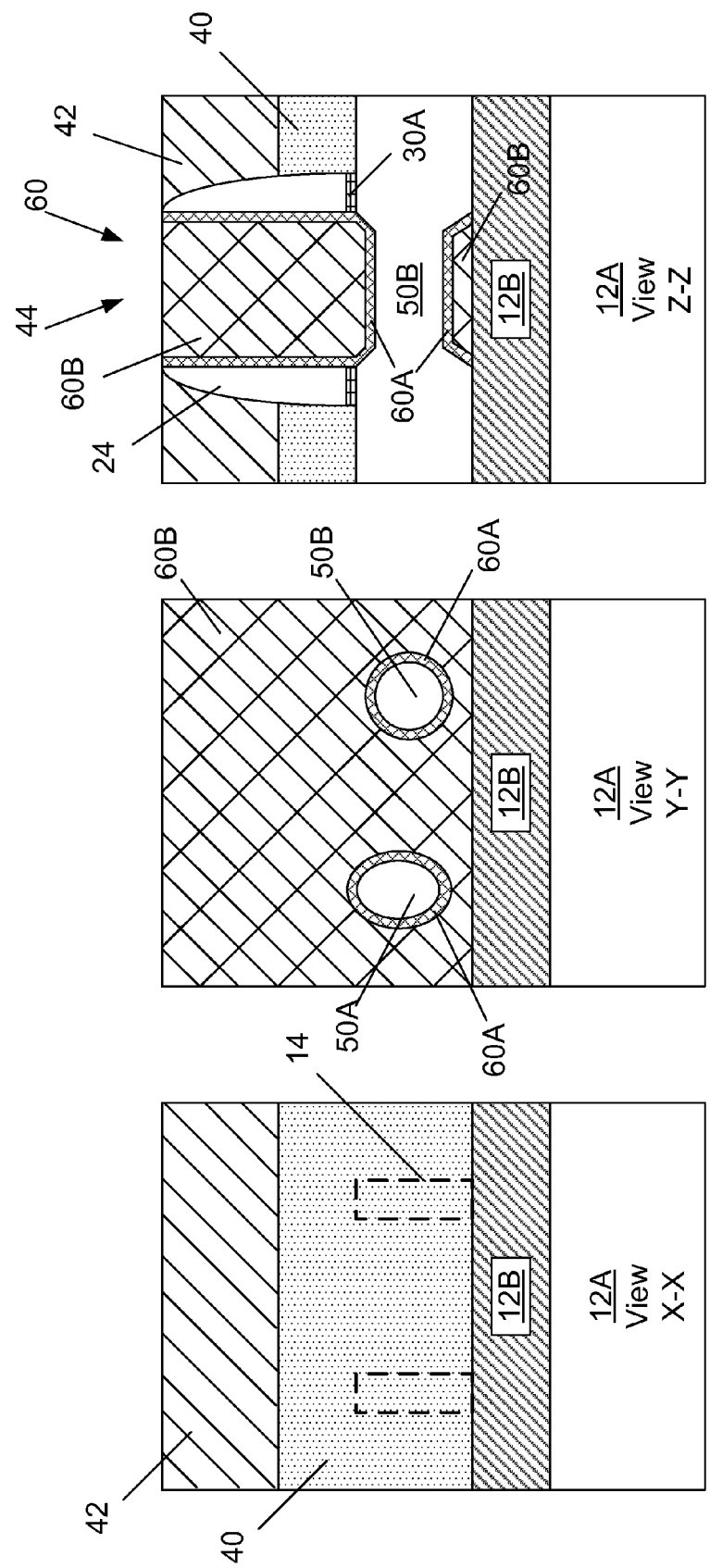

At this point in the process flow, as shown in FIG. 1I, a final gate structure 60 for the device 10 is formed in and around the exposed nanowires 50A, 50B and within the gate cavity 44. More specifically, a final gate insulation layer 60A may be formed on and around the exposed nanowires 50A, 50B and within the gate cavity 44 by performing, for example, a CVD process. The final gate insulation layer 60A may be comprised of a variety of different materials, such as, for example, a so-called high-k (k greater than 10) insulation material (where k is the relative dielectric constant), etc. The thickness of the gate insulation layer 60A may also vary depending upon the particular application, e.g., it may have a thickness of about 2-5 nm. In some applications, the thickness of the gate insulation layer 60A is such that it may completely fill the gap between the nanowires 50A, 50B and the box layer 12B, thereby preventing the gate electrode from completely surrounding the outer surface of the nanowire structures 50A, 50B. However, in other cases, such as the example depicted in FIG. 1I, the thickness of the gate insulation layer 60A and the size of the nanowires 50A, 50B is controlled such that the gate insulation layer 60A does not fill all of the gap between the nanowires 50A, 50B and the underlying box layer 12B, thereby leaving room for formation of the gate insulation layer 60A and a conductive gate electrode structure (discussed below) around the entire outer surface of the nanowires 50A, 50B.

The final gate electrode 60B may also be of one or more metal layers, e.g., TiN, TaN, W, Al, etc., that act as the gate electrode 60B. As will be recognized by those skilled in the art after a complete reading of the present application, the final gate structure of the device 10 depicted in the drawings, i.e., the gate insulation layer 60A and the gate electrode 60B, is intended to be representative in nature. In one illustrative embodiment, a conformal CVD process may be performed to form a gate insulation layer 60A comprised of hafnium oxide around the nanowires 50A, 50B and in the gate cavity 44. Thereafter, one or more metal layers (that will become the gate electrode 60A) may be deposited above the device 10 and in the cavity 44. Thereafter, one or more CMP processes may be performed to remove excess portions of the gate insulation layer 60A and the materials that comprise the gate electrode 60B that are positioned outside of the gate cavity 44 and above the layer of material 42. The aforementioned process operations result in the structure depicted in FIG. 1I. If desired, a capping layer (not shown), such as a layer of silicon nitride, may be formed above the structure depicted in FIG. 1I to protect the final gate structure 60 from further process operations. At this point, traditional manufacturing techniques may be performed to complete the manufacture of the device 10, e.g., the formation of various conductive contact structures (not shown) to various regions of the device 10, etc.

FIGS. 2A-2L depict an alternative process flow disclosed herein for forming an illustrative FinFET device with a nanowire gate structure. More specifically, in this alternative process flow, the fin reflow process 49 is performed prior to forming source/drain regions for the device 10. This alternative process flow may provide better short channel effects due to the nanowire channel structure and better dopant diffusion control since the fin reflow process 49 is performed prior to the formation of the source/drain regions, where a high temperature process typically occurs.

Figure 2A:
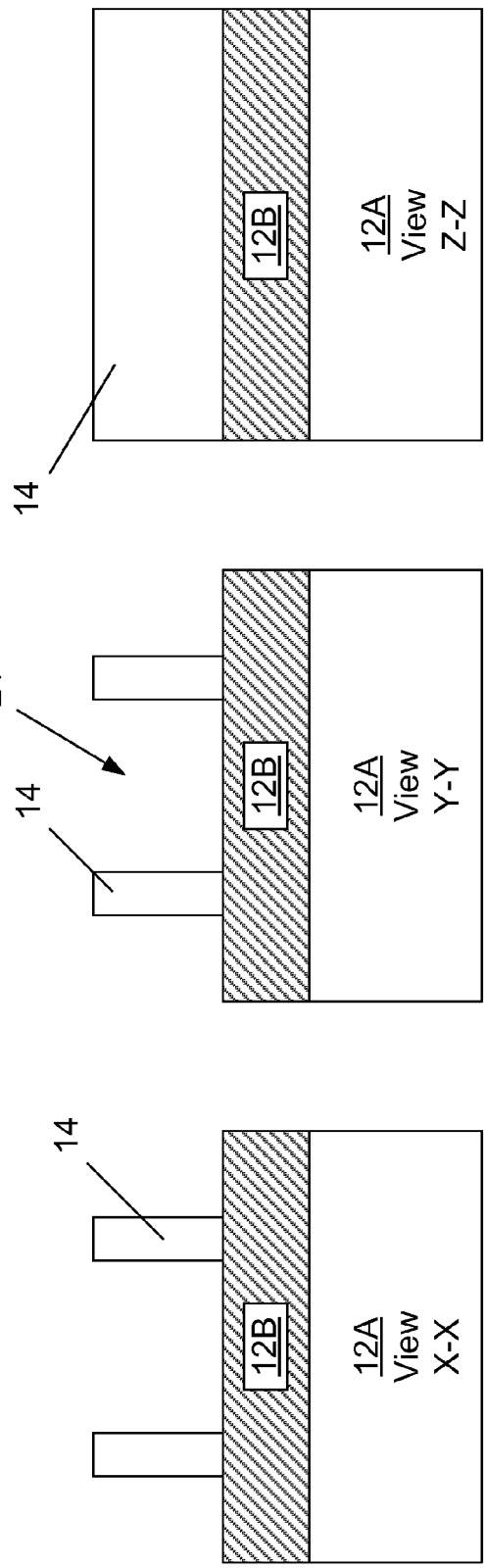
FIGS. 2A-2L depict an alternative process flow disclosed herein for forming an illustrative FinFET device with a nanowire gate structure.
Figure 2B:
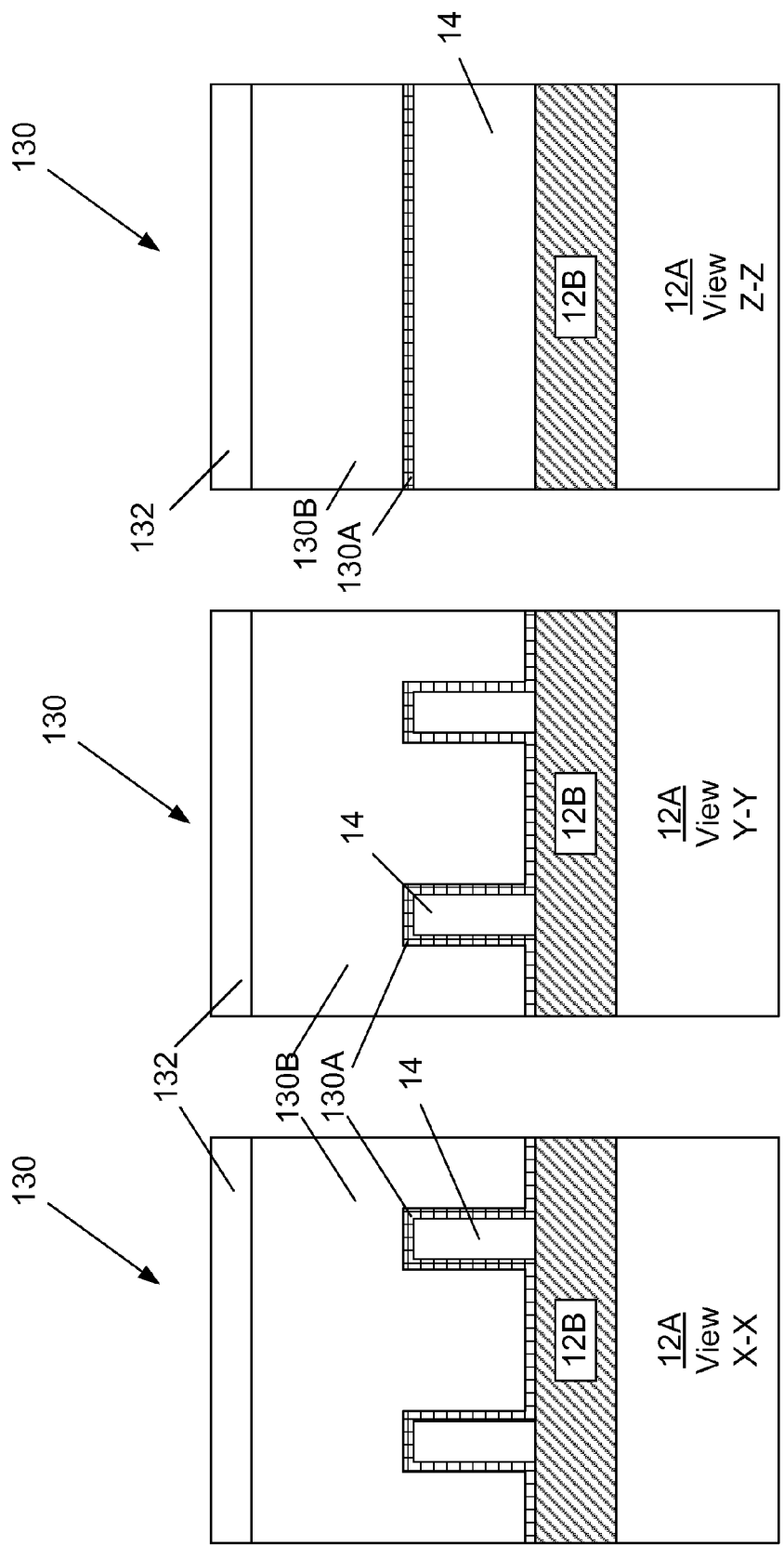
Figure 2C:
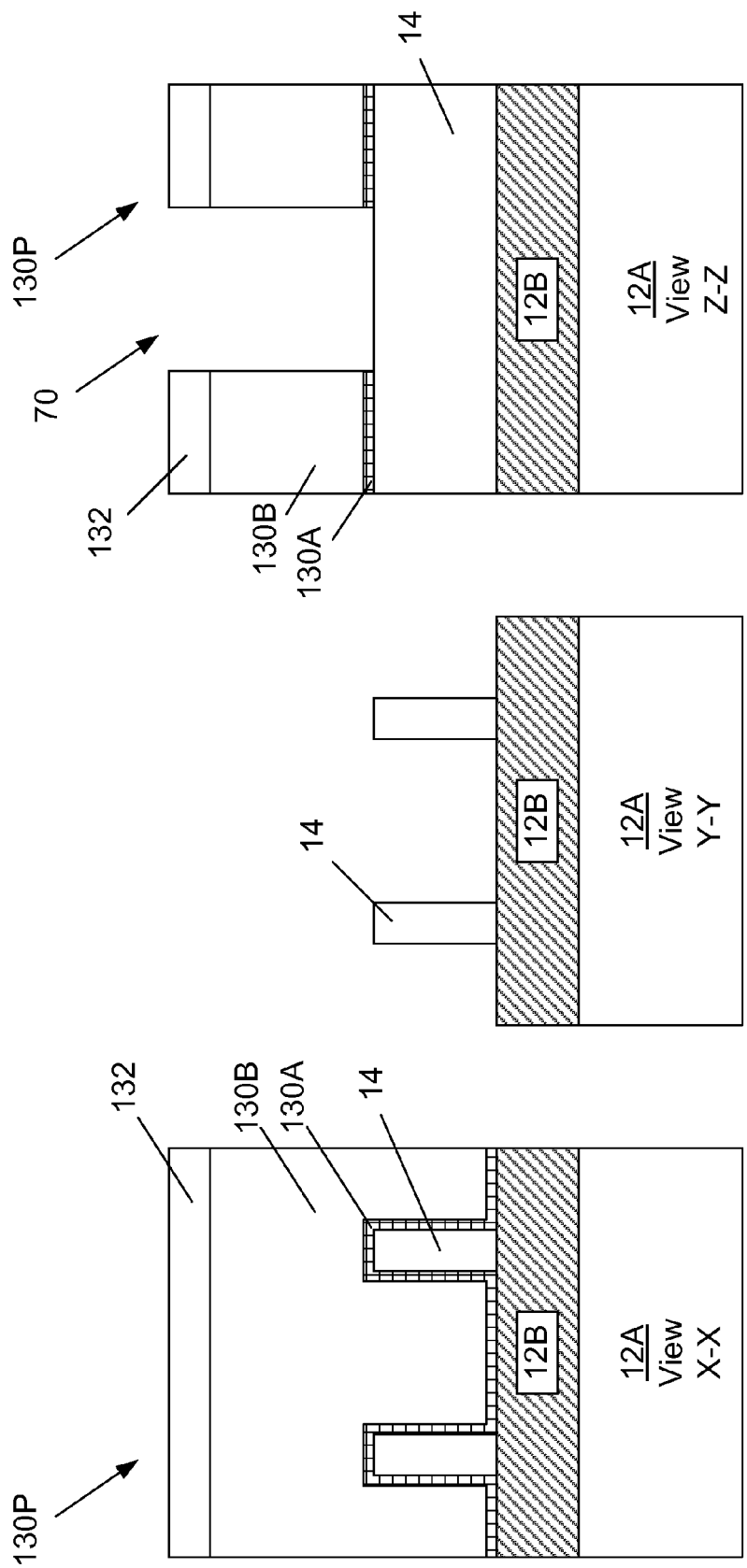

At the point of fabrication depicted in FIG. 2A, the fins 14 have been defined in the active layer 12C of the substrate 12. In FIG. 2B, a hard mask comprised of sacrificial layers 130A, 130B and 132 has been formed above the device. In one illustrative embodiment, the sacrificial layers 130A, 130B and 132 may be of the same construction as that of the previously described sacrificial gate insulation layer 30A, the sacrificial gate electrode 30B and the mask layer 32, respectively. Of course, the sacrificial layers 130A, 130B and 132 may be made from a variety of other materials. As shown in FIG. 2C, a patterned etch mask (not shown) comprised of a photoresist material is formed above the hard mask 130 using known photolithography tools and techniques. Thereafter, one or more etching processes are performed through the patterned etch mask to define an opening or cavity 70 that extends through the sacrificial layers 130A, 130B and 132. This results in the formation of a patterned hard mask 130P wherein the opening 70 exposes a portion of the fin 14.

Figure 2D:
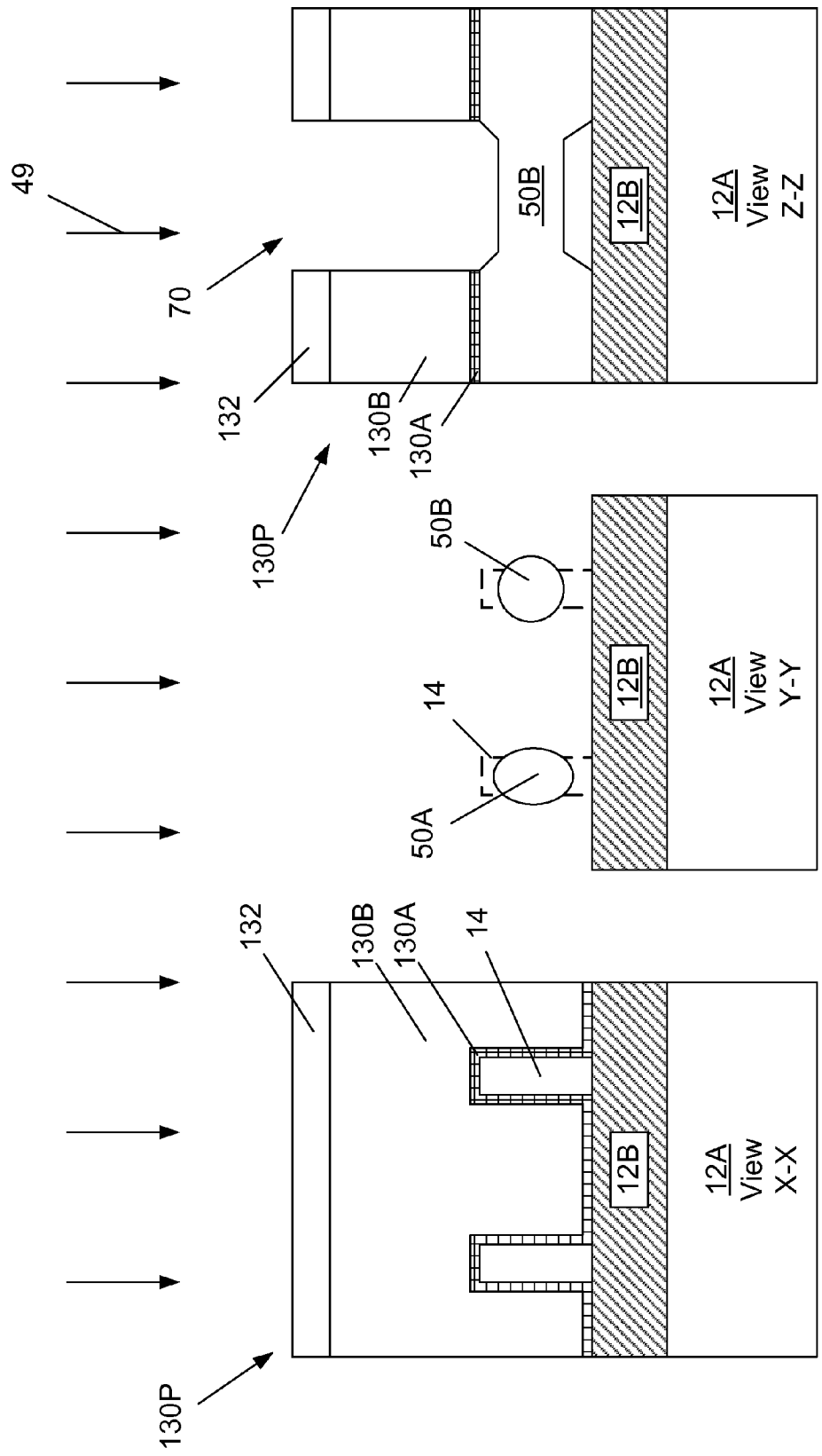
Figure 2E:
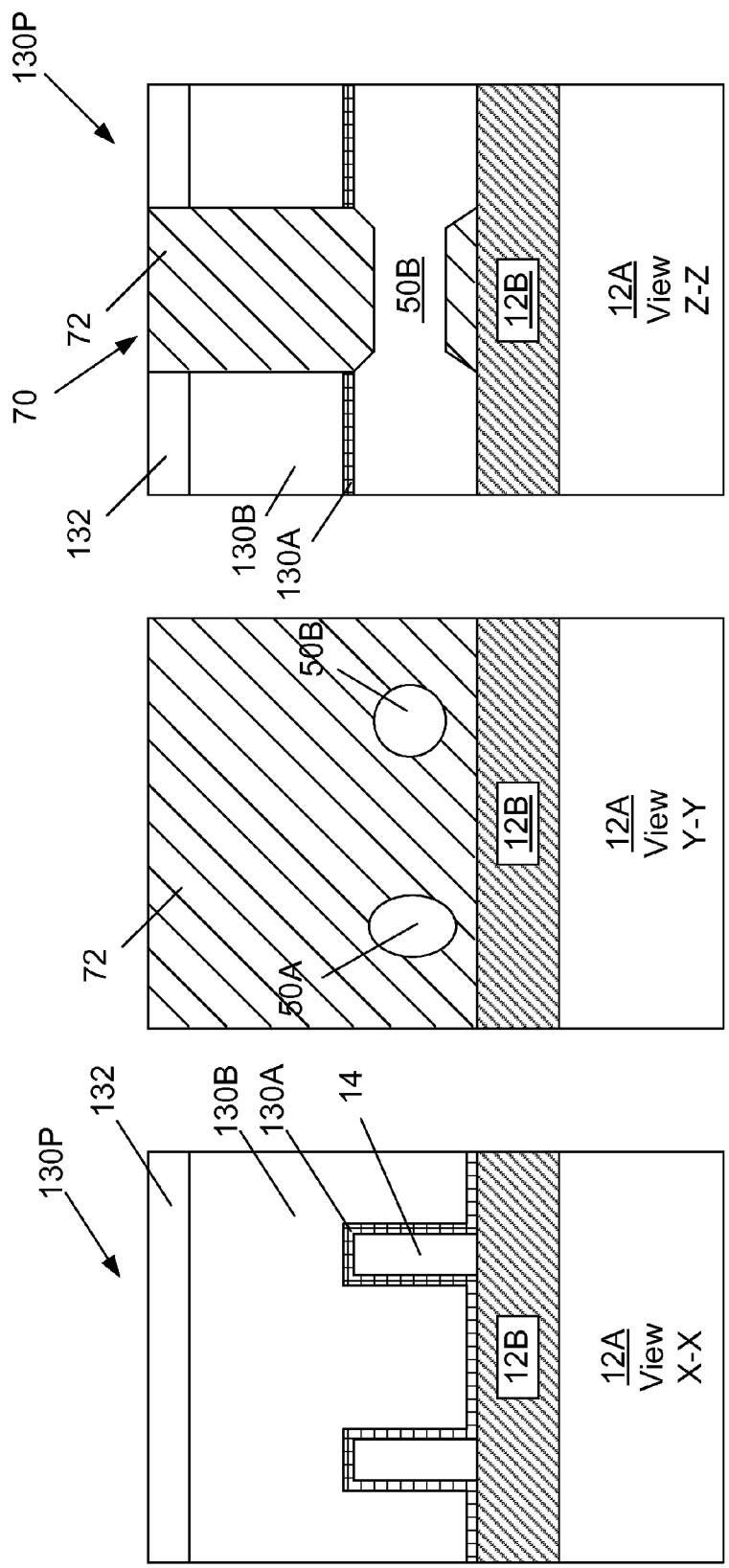
Figure 2F:
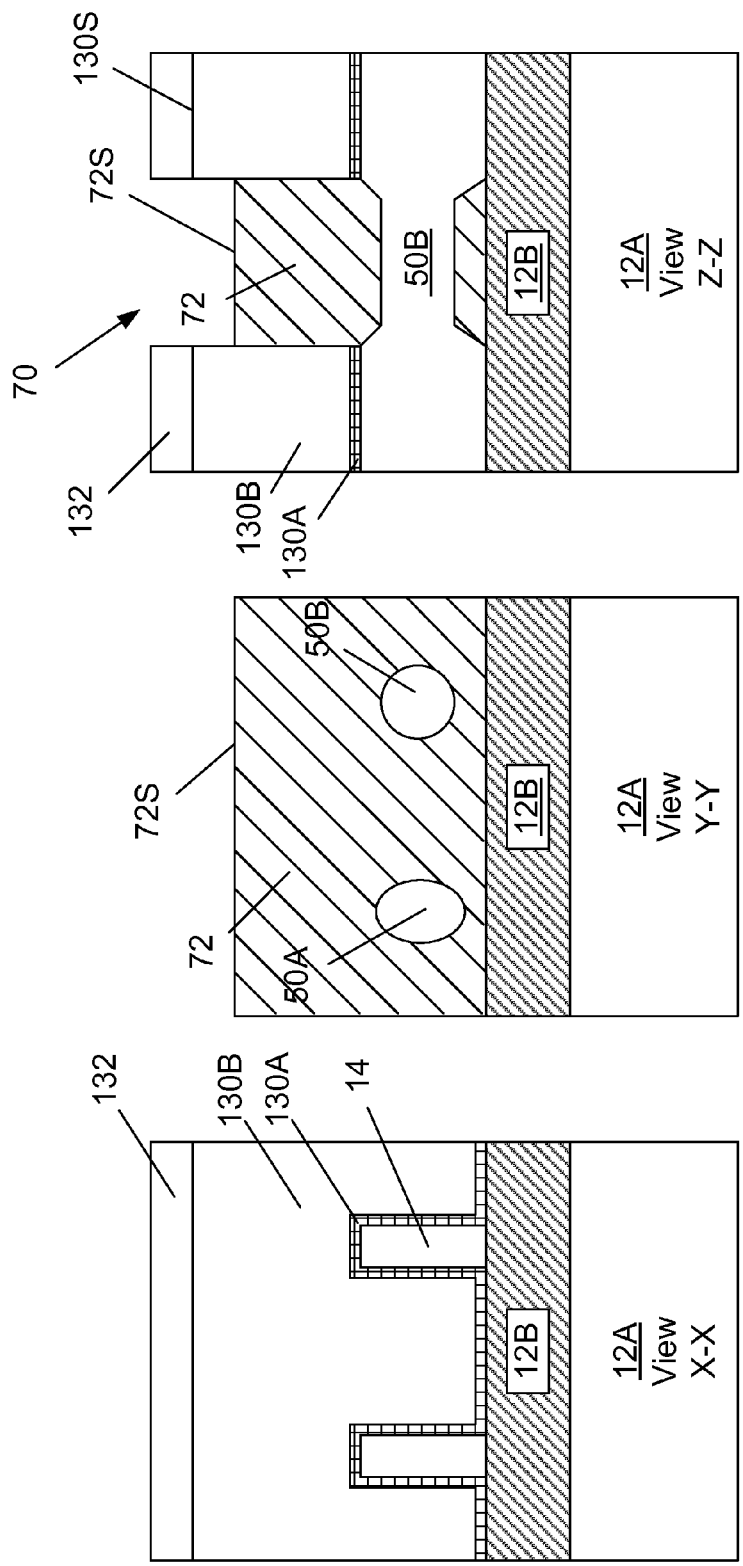
Figure 2G:
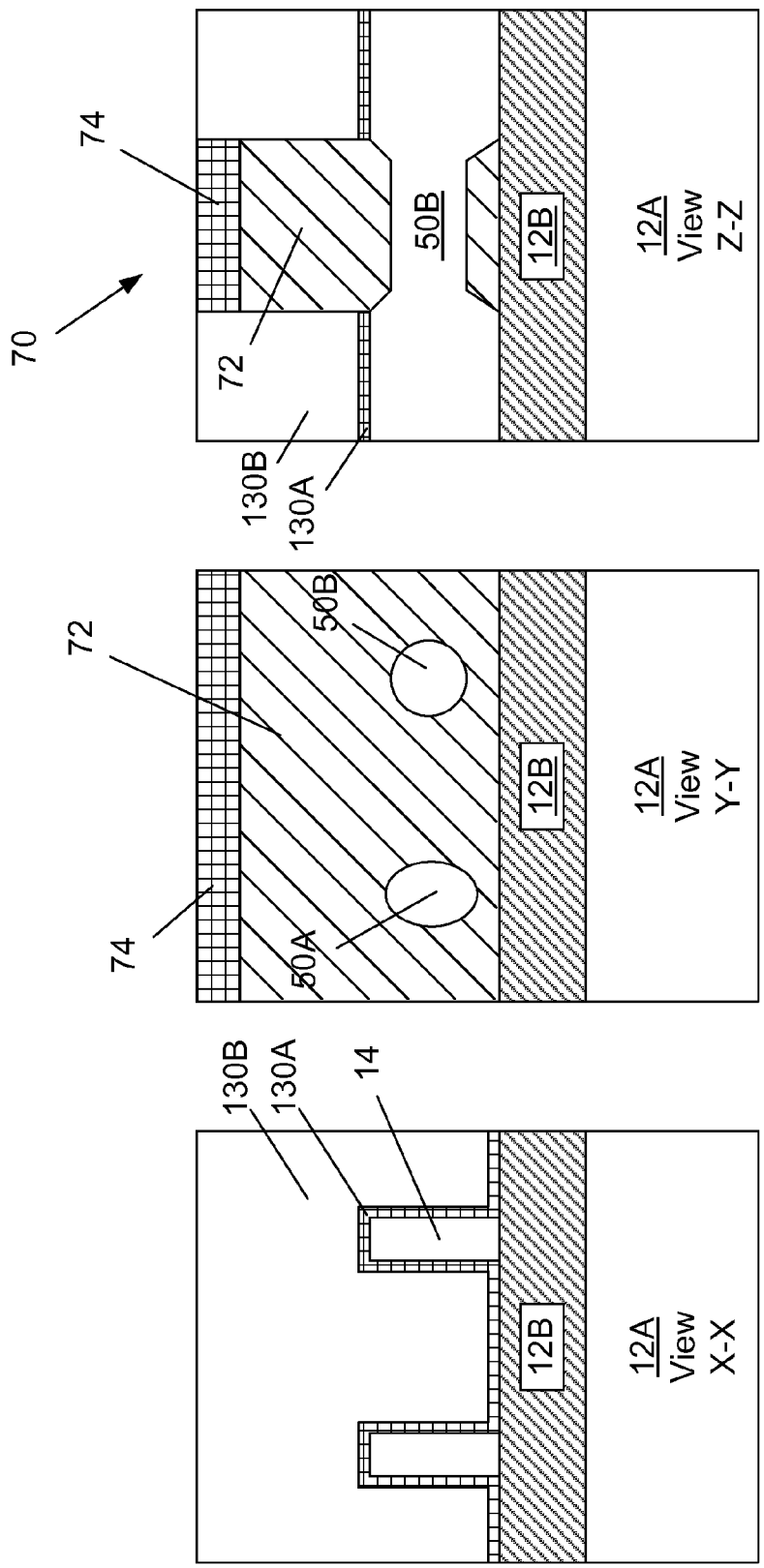

FIG. 2D depicts the device 10 after the previously described fin reflow process 49 is performed through the cavity 70 in the patterned hard mask 130P on the exposed portions of the fins 14 that underlie the cavity 70. The reflow process 49 results in the previously described nanowires 50A, 50B. FIG. 2E depicts the device 10 after a layer of insulating material 72, such as a flowable oxide material has been formed on the device 10 and after a CMP process has been performed that stops on the sacrificial layer 132. FIG. 2F depicts the device 10 after an etch-back process has been performed to recess the layer of insulating material 72 such that an upper surface 72S of the layer of insulating material 72 is positioned below an upper surface 130S of the sacrificial layer 130B. FIG. 2G depicts the device 10 after a layer of material 74, e.g., silicon nitride, has been formed on the device 10 and after an etch-back or CMP process has been performed that stops on the sacrificial layer 130B.

Figure 2H:
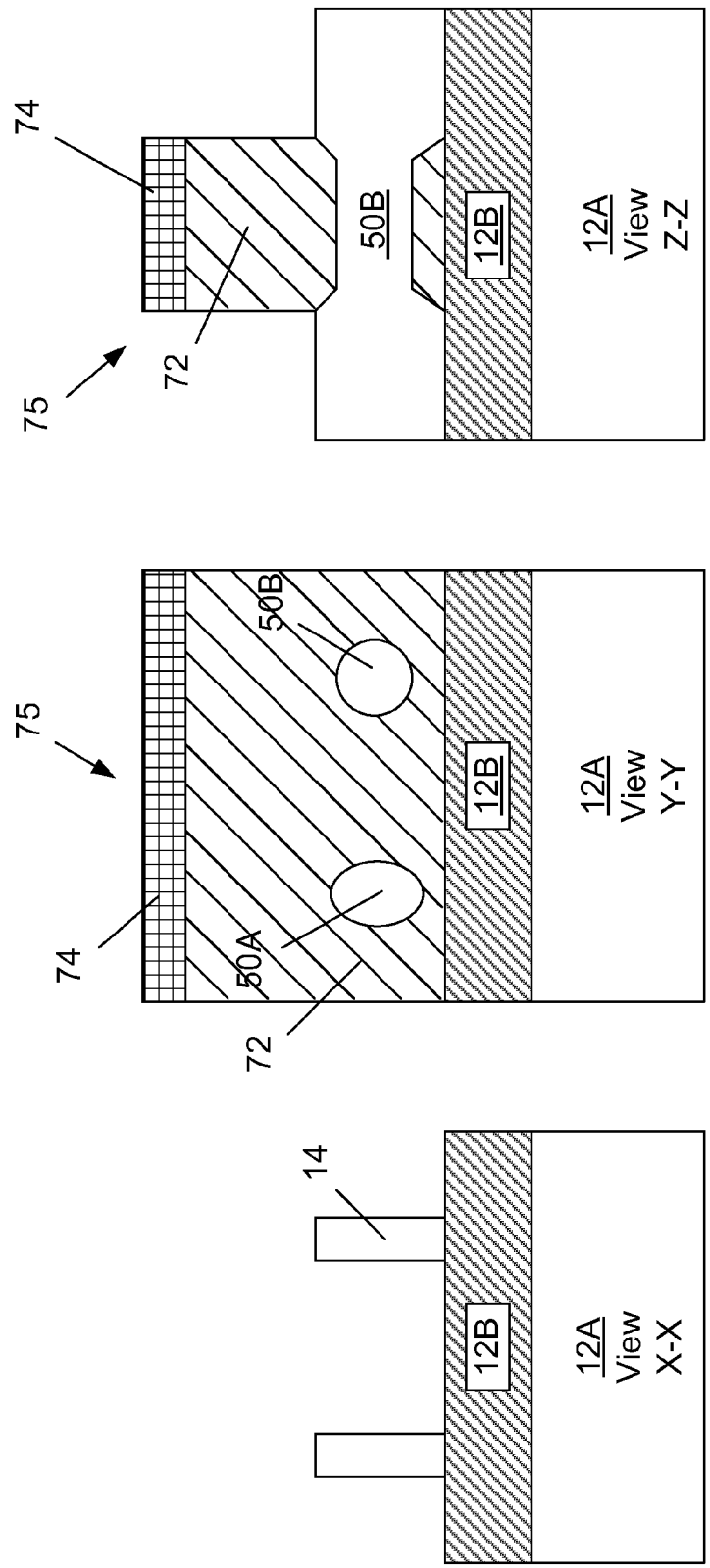
Figure 2I:
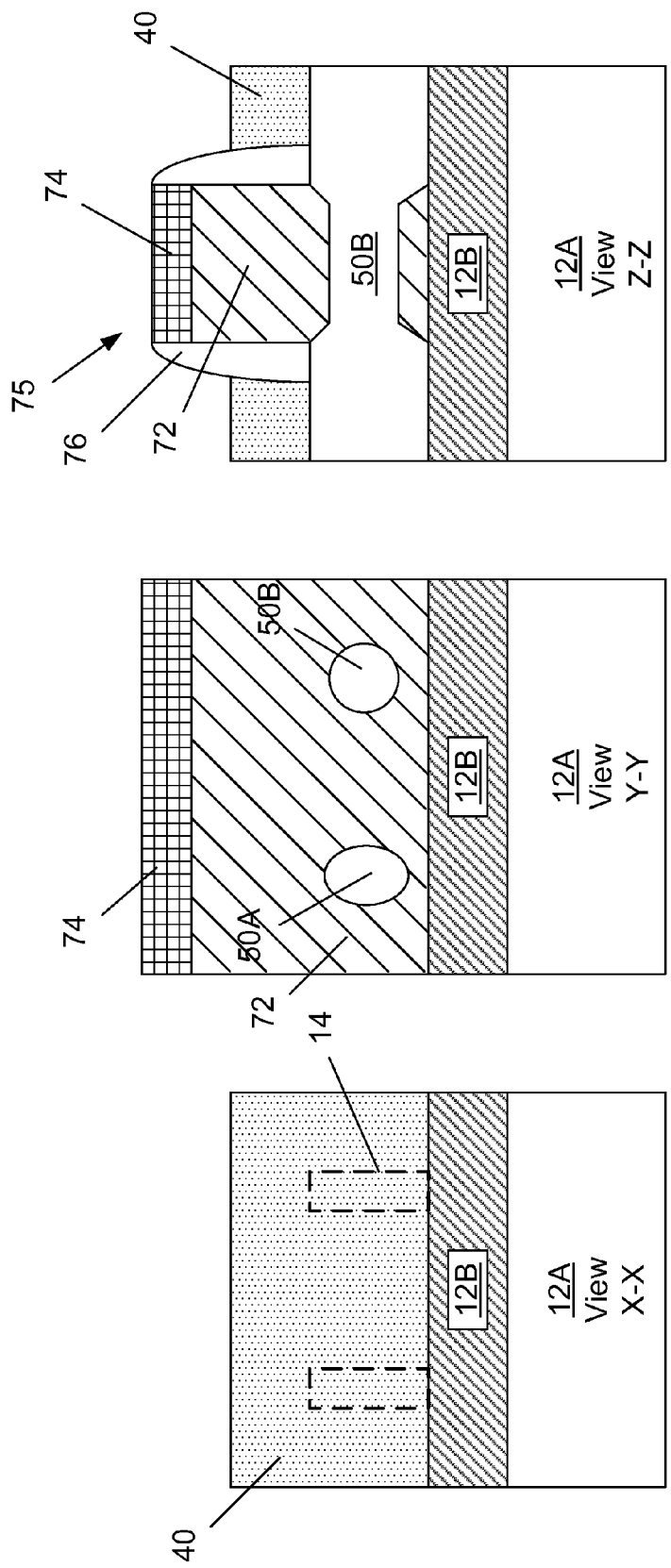

Next, as shown in FIG. 2H, one or more etching processes were performed to remove the remaining portions of the patterned hard mask 130P, i.e., sacrificial layers 130A and 130B (see FIG. 2G), from the device 10. Thus, in this illustrative process flow, the layers of material 72, 74 define a sacrificial gate structure 75 that will eventually be replaced with a replacement gate structure as described more fully below. FIG. 2I depicts the device 10 after several process operations have been performed. First, a sidewall spacer 76 was formed adjacent the sacrificial gate structure 75. The spacer 76 may be formed by conformably depositing a layer of spacer material, e.g., silicon nitride, and thereafter performing an anisotropic etching process to define the sidewall spacer 76. Thereafter, an epi deposition process was performed to form the previously described semiconductor material 40 on the fins 14, i.e., this process is the previously mentioned fin-merger process. However, as noted above, this fin merger process is optional in nature and not required to practice the novel inventions disclosed herein. A dopant activation anneal process may be performed at this point in the process flow.

Figure 2J:
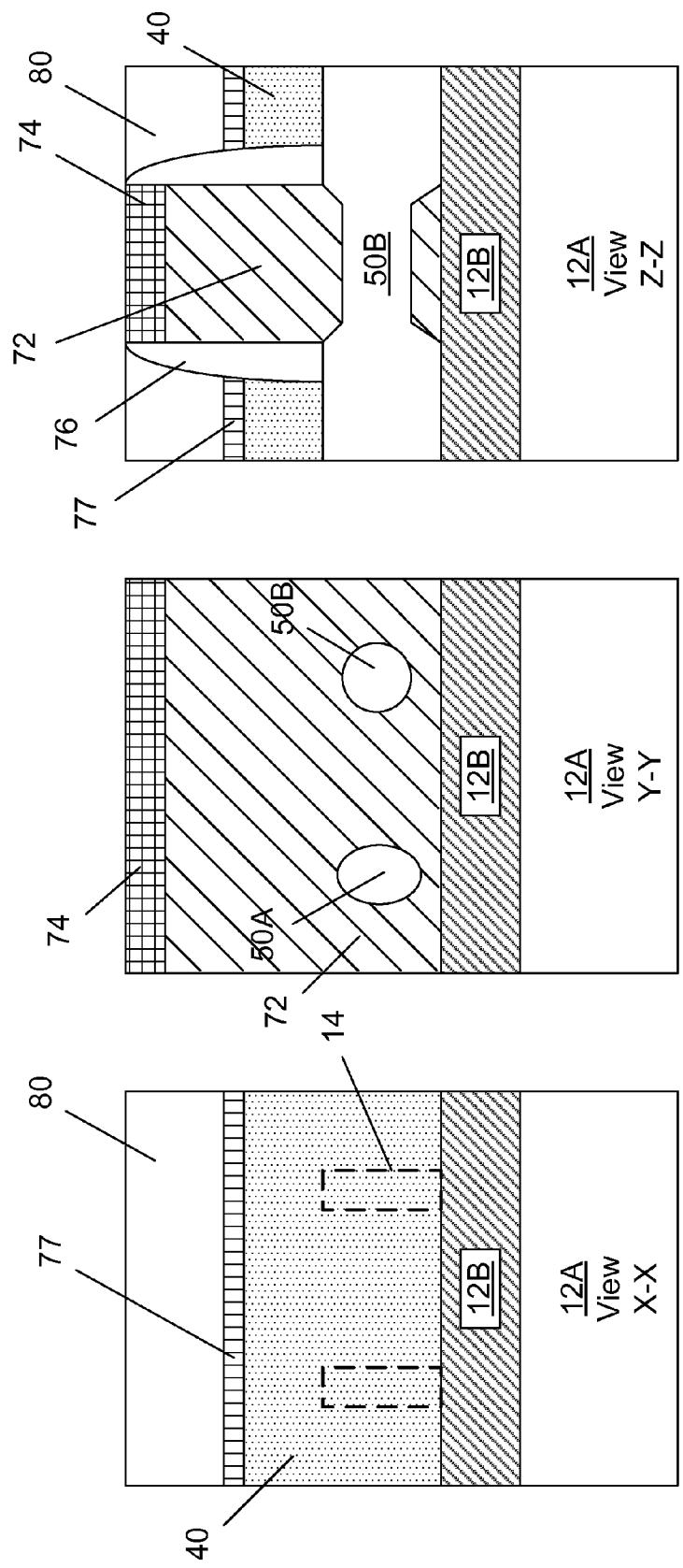

FIG. 2J depicts the device 10 after several process operations have been performed. First, a relatively thin layer of material 77, e.g., silicon nitride, with a thickness of about 2-6 nm was formed on the device 10 by performing a CVD process. Next, a gap fill material 80, such as amorphous silicon material, was deposited on the device 10 and a CMP process was performed that stops on the layer 74.

Figure 2K:
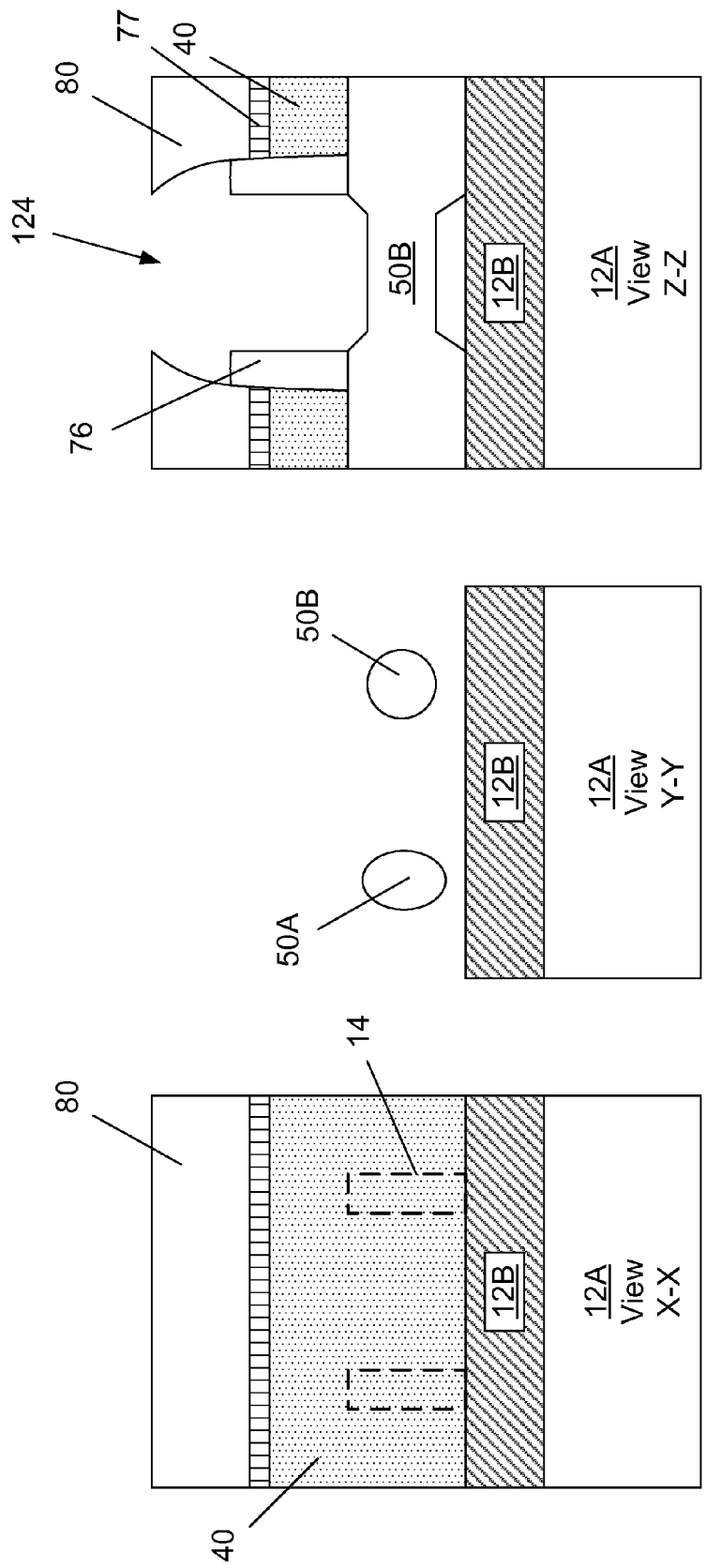

FIG. 2K depicts the device 10 after one or more etching processes have been performed to remove the sacrificial gate structure 75, i.e., the layers 72 and 74 (see FIG. 2J), to thereby define a gate cavity 124. More specifically, an initial etching process was performed to remove the silicon nitride layer 74 and portions of the spacers 76. Thereafter, another etching process was performed to remove the now-exposed material layer 72, i.e., silicon dioxide material. The gate cavity 124 is at least partially laterally defined by the spacers 76 and the material layer 80.

Figure 2L:
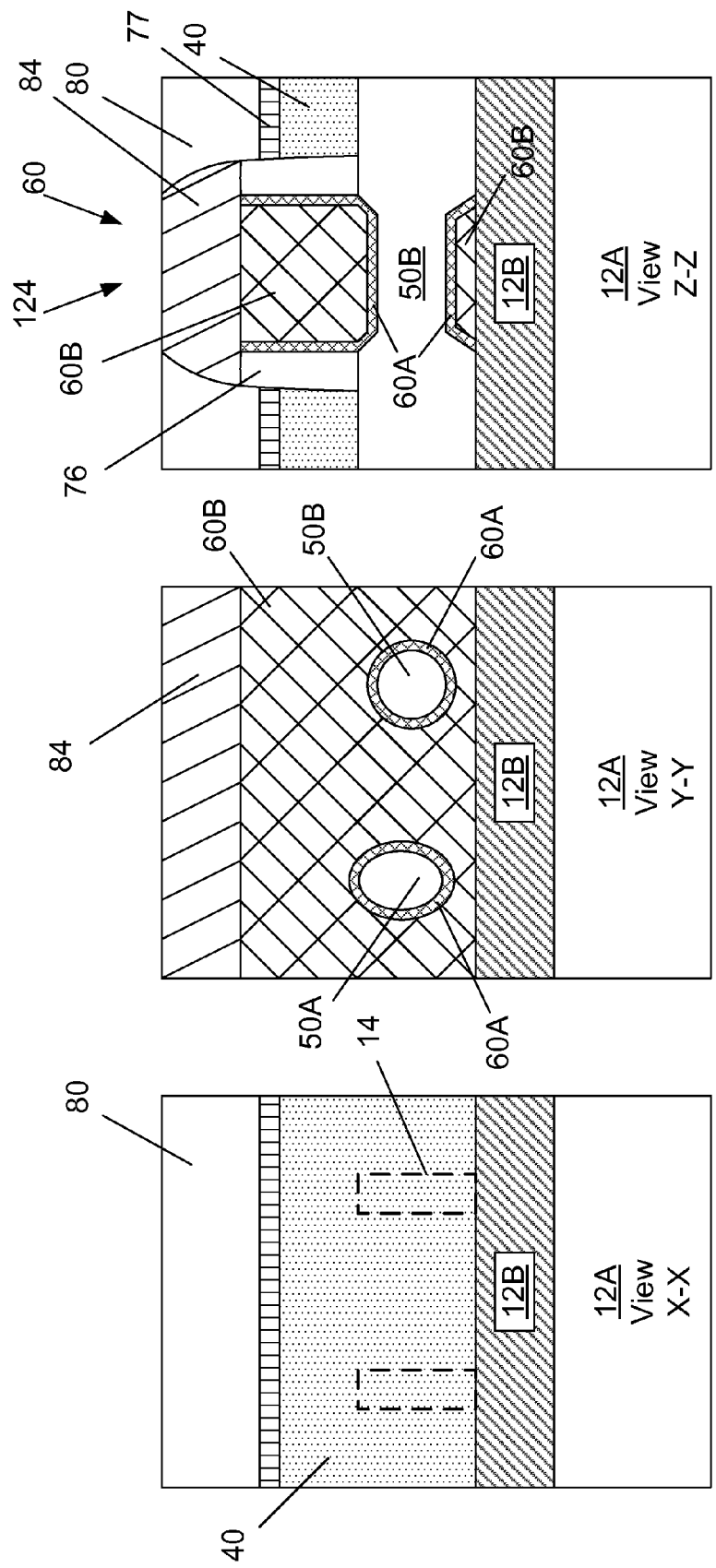

At this point in the process flow, as shown in FIG. 2L, the previously described final gate structure 60 for the device 10 is formed in and around the exposed nanowires 50A, 50B and within the gate cavity 124. The comments above regarding the nanowires 50A, 50B and the final gate structure 60 apply equally to this alternative process flow as well. More specifically, the final gate insulation layer 60A may be formed on and around the exposed nanowires 50A, 50B and within the gate cavity 124 by performing, for example, a CVD process. The final gate electrode 60B may be comprised of one or more metal layers that act as the gate electrode 60B. The material layers that are part of the final gate structure 60 may be formed in the gate cavity 124 and above the material layer 80. Thereafter, one or more CMP processes may be performed to remove excess portions of the materials that comprise the final gate structure 60. Next, an etch back process is performed to recess the upper surface of the final gate structure 60, and a gate cap layer 84, such as a layer of silicon nitride, may be formed above the structure depicted in FIG. 2L to protect the final gate structure 60 from further process operations. Thereafter, the layer 80 may be removed, silicide regions (not shown) may be formed on the source/drain regions, and a layer of insulating material, e.g., silicon dioxide, may be deposited on the device 10 and subjected to a CMP process. At this point, traditional manufacturing techniques may be performed to complete the manufacture of the device 10, e.g., the formation of various conductive contact structures (not shown) to various regions of the device 10, etc.

As yet another alternative, at the point in the process flow shown in FIG. 2D—after the previously described fin reflow process 49 is performed through the cavity 70 in the patterned hard mask 130P to form the nanowire structures 50A, 50B—a layer of gate electrode material (not shown), e.g., polysilicon, is deposited, polished and recessed below the top surface of the sacrificial layer 130B. After that, a SiN cap layer may be formed above the polysilicon layer by depositing a layer of silicon nitride, followed by performing an etchback or CMP polish-back that defines the gate structure for the device (silicon dioxide gate insulation layer, polysilicon gate electrode and silicon nitride gate cap layer). Then, the layers 130B and 130A may be removed, and a sidewall spacer may be formed adjacent the gate cap layer and the gate electrode of the gate structure. Source/drain epi and implantation may then be formed self-aligned to the sidewall spacer, and subsequent contact and metallization processes may just follow conventional silicon process technology flow.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
   forming a fin comprised of a semiconducting material, said fin having a first, as-formed cross-sectional configuration;
   forming a sacrificial gate structure above said fin;
   forming sidewall spacers adjacent at least a portion of said sacrificial gate structure;
   removing said sacrificial gate structure to thereby define a gate cavity that exposes a portion of said fin, wherein said gate cavity is laterally defined by said spacers;
   performing a fin reflow process on said exposed portions of said fin to define a nanowire structure having a cross-sectional configuration that is different from said first cross-sectional configuration; and
   forming a replacement gate structure in said gate cavity and at least partially around said nanowire structure.

2. The method of claim 1, wherein said first cross-sectional configuration of said fin is approximately rectangular and wherein said cross-sectional configuration of said nanowire structure is approximately circular or approximately elliptical.

3. The method of claim 1, wherein an as-formed cross-sectional area of said fin is approximately equal to a cross-sectional area of said nanowire structure.

4. The method of claim 1, wherein said semiconducting material is comprised of silicon.

5. The method of claim 1, wherein performing said fin reflow process comprises performing a hydrogen anneal process.

6. The method of claim 5, wherein said hydrogen anneal process is performed within the range of about 900-1100° C. for a duration of about 60-600 seconds.

7. The method of claim 1, wherein forming said replacement gate structure in said gate cavity comprises forming said replacement gate structure in said gate cavity and completely around an outer surface of said nanowire structure.

8. The method of claim 1, wherein said sacrificial gate structure is comprised of a silicon dioxide gate insulation layer and a polysilicon gate electrode positioned above said gate insulation layer.

9. The method of claim 1, wherein said replacement gate structure comprises a gate insulation layer comprised of a high-k insulating material and a gate electrode comprised of at least one layer of metal.

10. A method of forming a FinFET device, comprising:
    forming a fin comprised of silicon, said fin having a first, as-formed cross-sectional configuration;
    forming a sacrificial gate structure above said fin;
    forming sidewall spacers adjacent at least a portion of said sacrificial gate structure;
    removing said sacrificial gate structure to thereby define a gate cavity that exposes a portion of said fin, wherein said gate cavity is laterally defined by said spacers;
    performing a hydrogen anneal process on said exposed portions of said fin to define a nanowire structure having a cross-sectional configuration that is different from said first cross-sectional configuration; and
    forming a replacement gate structure in said gate cavity and completely around an outer surface of said nanowire structure.

11. The method of claim 10, wherein said first cross-sectional configuration of said fin is approximately rectangular and wherein said cross-sectional configuration of said nanowire structure is approximately circular or approximately elliptical.

12. The method of claim 10, wherein an as-formed cross-sectional area of said fin is approximately equal to a cross-sectional area of said nanowire structure.

13. The method of claim 10, wherein said hydrogen anneal process is performed within the range of about 900-1100° C. for a duration of about 60-600 seconds.

14. The method of claim 10, wherein said sacrificial gate structure is comprised of a silicon dioxide gate insulation layer and a polysilicon gate electrode positioned above said gate insulation layer.

15. The method of claim 10, wherein said replacement gate structure comprises a gate insulation layer comprised of a high-k insulating material and a gate electrode comprised of at least one layer of metal.

* * * * *

UNITED STATES PATENT AND TRADEMARK OFFICE
CERTIFICATE OF CORRECTION

PATENT NO. : 8,541,274 B1
APPLICATION NO. : 13/609828
DATED : September 24, 2013
INVENTOR(S) : Ruilong Xie et al.

Page 1 of 1

It is certified that error appears in the above-identified patent and that said Letters Patent is hereby corrected as shown below:

On the title page, please amend the Assignee item (73) to read as follows:

Assignees: GLOBALFOUNDRIES Inc., Grand Cayman (KY) and International Business Machines Corporation, Armonk, NY (US)

Signed and Sealed this
First Day of December, 2015

Michelle K. Lee
*Director of the United States Patent and Trademark Office*